(12) United States Patent
Peng et al.

(10) Patent No.: US 8,353,494 B2
(45) Date of Patent: Jan. 15, 2013

(54) MOUNTING APPRATUS FOR SLIDE RAIL

(75) Inventors: Wen-Tang Peng, Taipei Hsien (TW); Mo-Ming Yu, Shenzhen (CN); Guang-Hua Gu, Shenzhen (CN); Ze-Hong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 392 days.

(21) Appl. No.: 12/765,787

(22) Filed: Apr. 22, 2010

(65) Prior Publication Data
US 2011/0233355 A1 Sep. 29, 2011

(30) Foreign Application Priority Data

Mar. 24, 2010 (CN) .......................... 2010 1 0132026

(51) Int. Cl.
*A47B 96/00* (2006.01)
(52) U.S. Cl. ............. 248/298.1; 248/218.4; 248/221.11; 248/222.11; 211/192
(58) Field of Classification Search ............... 248/218.4, 248/235, 239, 220.21, 220.22, 221.11, 222.11, 248/298.1, 224.8; 403/315, 316, 319; 211/26, 211/192; 312/333, 334.1, 334.4, 334.7, 334.8, 312/319.1, 332.1, 223.1–223.2; 361/724–727
See application file for complete search history.

(56) References Cited

U.S. PATENT DOCUMENTS

| | | | | |
|---|---|---|---|---|
| 7,144,184 B1* | 12/2006 | Tsai | ............................... | 403/350 |
| 7,284,672 B2* | 10/2007 | Tsai | ............................... | 211/208 |
| 7,357,362 B2* | 4/2008 | Yang et al. | ............... | 248/221.11 |
| 7,731,142 B2* | 6/2010 | Chen et al. | ..................... | 248/244 |
| 7,740,329 B2* | 6/2010 | Hsiung et al. | ............... | 312/334.4 |
| 7,950,753 B2* | 5/2011 | Liang | ......................... | 312/334.4 |
| 8,033,621 B2* | 10/2011 | Liang | ......................... | 312/334.4 |
| 2005/0156493 A1* | 7/2005 | Yang et al. | .................. | 312/334.5 |
| 2008/0122333 A1* | 5/2008 | Tseng et al. | .................. | 312/333 |
| 2011/0290746 A1* | 12/2011 | Lu | .................................. | 211/26 |

* cited by examiner

*Primary Examiner* — Terrell McKinnon
*Assistant Examiner* — Ingrid M Weinhold
(74) *Attorney, Agent, or Firm* — Altis Law Group, Inc.

(57) ABSTRACT

A mounting apparatus is provided for mounting a slide rail to a rack post defining a plurality of through holes. The mounting apparatus includes a supporting bracket slidably mounted to the slide rail, and a resilient latch member. The supporting bracket includes an end plate at the front end with two inserting pins extending from a front surface of the end plate and engaged in corresponding through holes of the rack post. The latch member includes a middle plate retained to the supporting bracket, and a latch arm extending forwards. The latch member is operable to be deformed to make the latch arm abut a front surface of the rack post, to prevent the inserting pin from retracting from corresponding through holes.

4 Claims, 7 Drawing Sheets

MOUNTING APPRATUS FOR SLIDE RAIL

BACKGROUND

1. Technical Field

The present invention relates to mounting apparatuses and, more particularly, to a mounting apparatus for a slide rail.

2. Description of the Related Art

Traditionally, a slide rail is used between two objects that can move relative to each other, such as between a desk and a drawer, or a server and a rack.

A conventional slide rail assembly for a drawer and a desk includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a distance out from the desk. A plurality of screws is used for mounting the outer slide rail to a bracket of the desk. Therefore, installing or uninstalling the outer slide rail to or from the bracket can be inconvenient and time-consuming.

DETAILED DESCRIPTION

Figure 1:
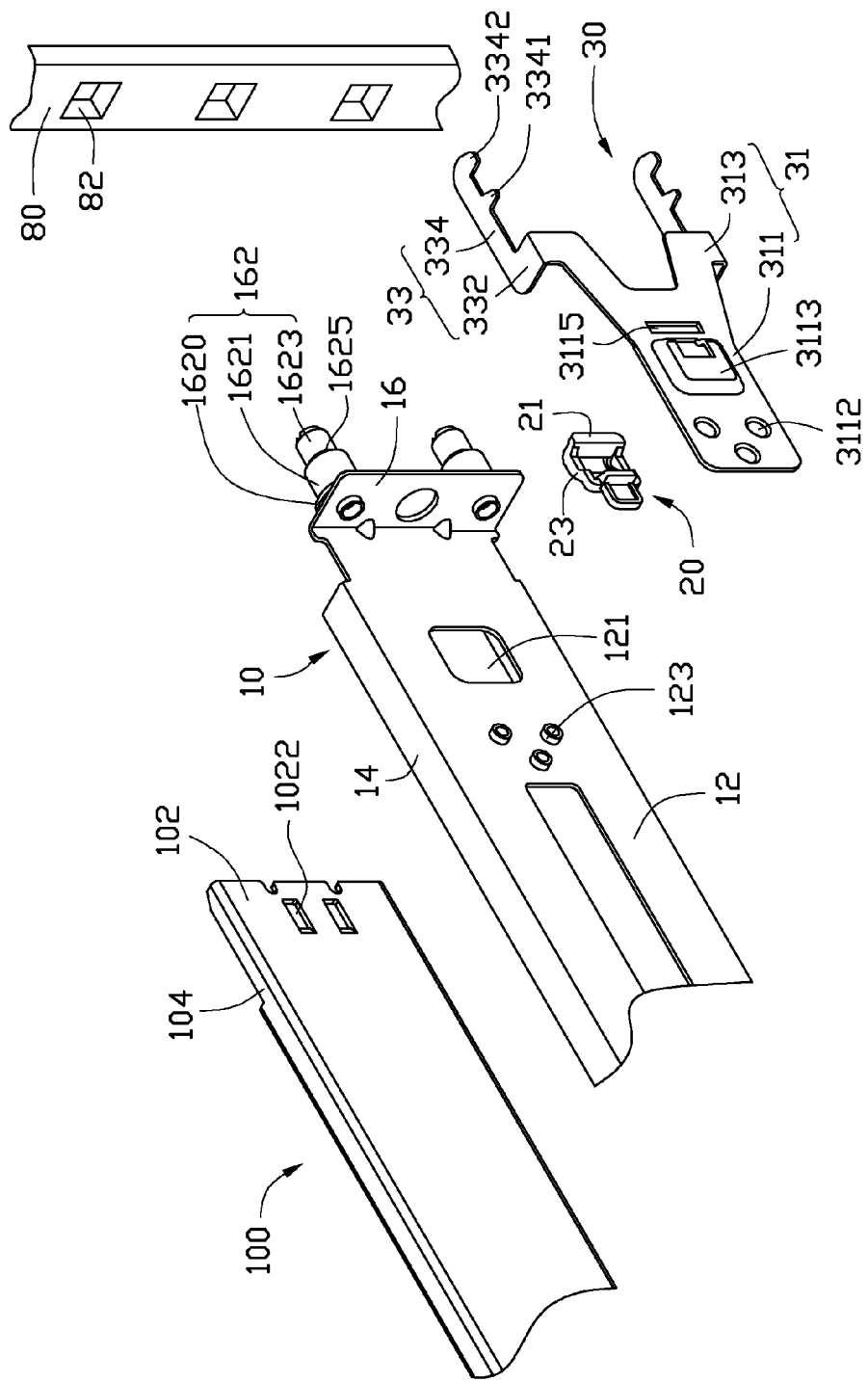
FIGS. 1 and 2 are exploded, isometric views from different perspectives of an embodiment of a mounting apparatus, a slide rail, and a first rack post.
Figure 2:
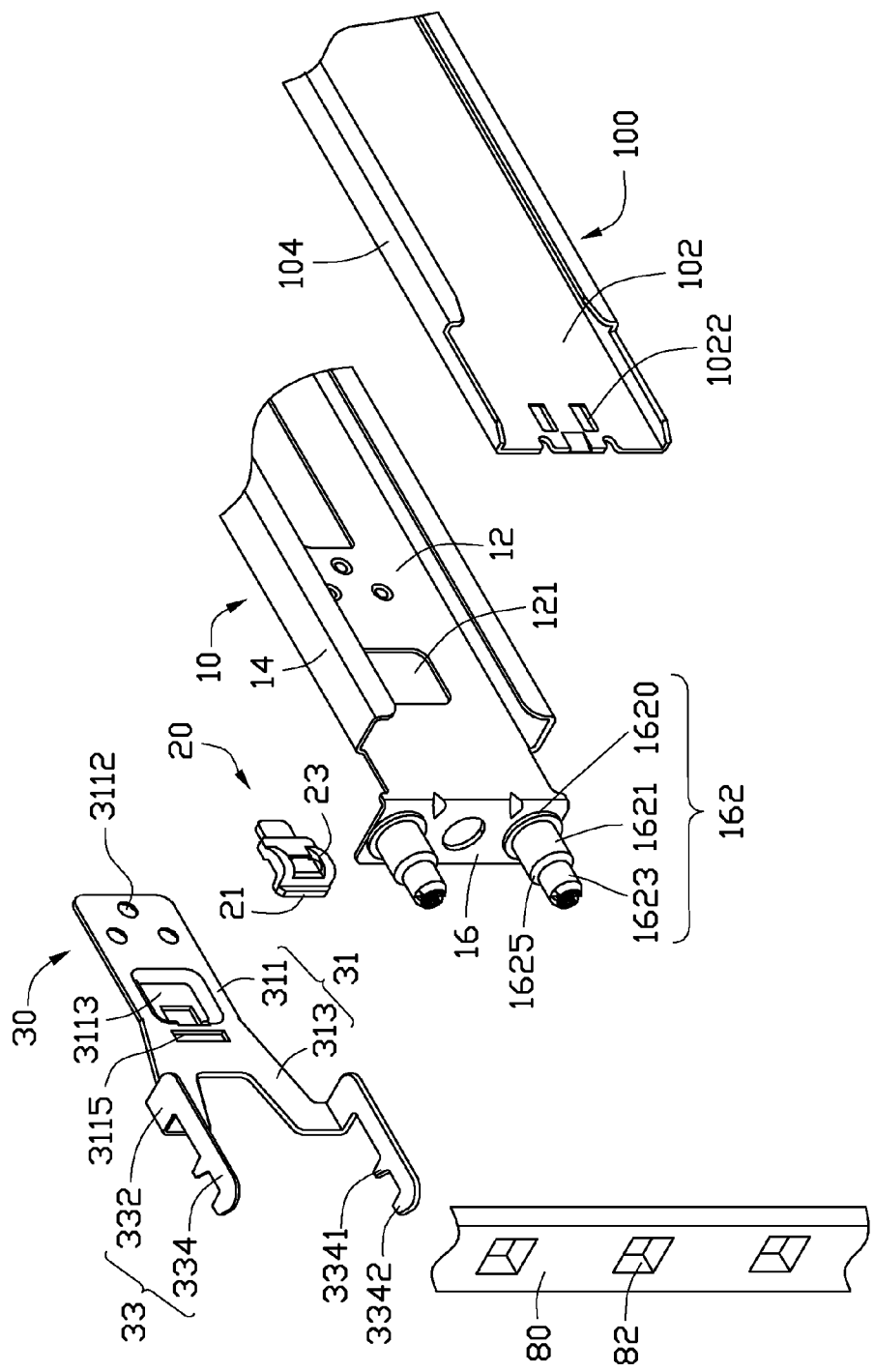
Figure 6:
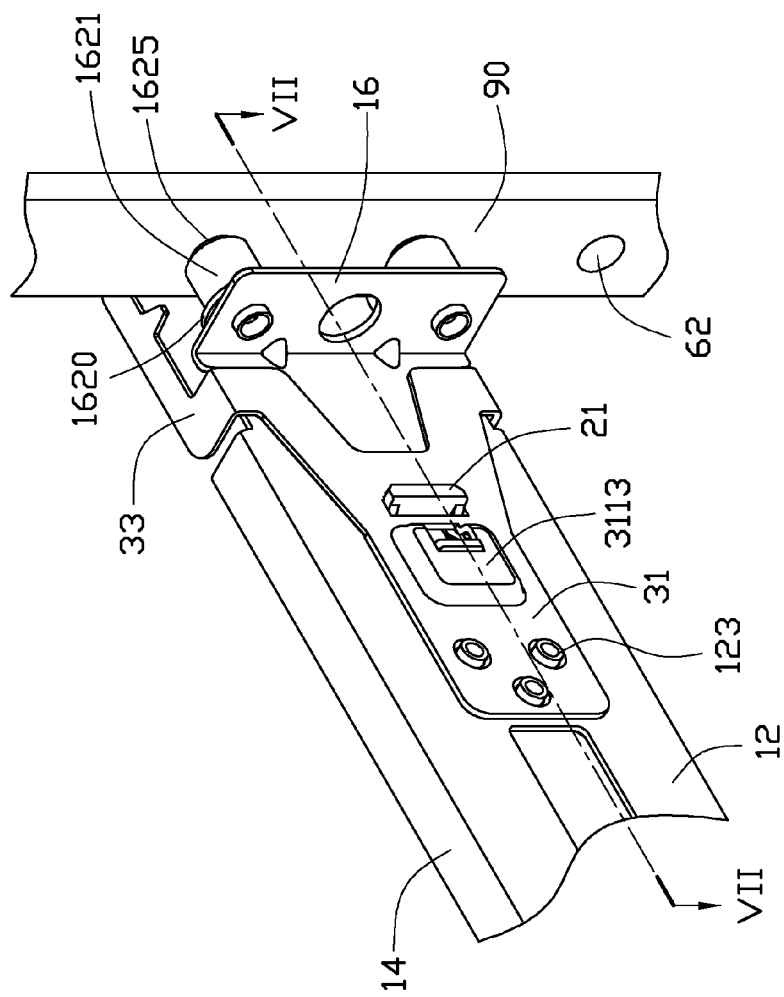
FIG. 6 is an assembled view of the mounting apparatus and the slide rail of FIG. 1, and a second rack post.

Referring to FIGS. 1, 2, and 6, an embodiment of a mounting apparatus is provided for mounting a slide rail 100 to a component rack. The component rack may include a plurality of first rack posts 80 defining a plurality of rectangular through holes 82 (shown in FIGS. 1 and 2), or include a plurality of second rack posts 90 defining a plurality of round through holes 62 (shown in FIG. 6). The mounting apparatus includes a supporting bracket 10, an actuating member 20, and a latch member 30.

The slide rail 100 has a substantially C-shaped cross section, and includes a web 102 and two flanges 104 extending from opposite sides of the web 102, respectively. The web 102 defines two slots 1022 substantially adjacent to a front end of the slide rail 100.

The supporting bracket 10 includes a side plate 12, two flanges 14 substantially perpendicularly extending inwards from opposite sides of the side plate 12, and an end plate 16 extending outwards from a front end of the slide plate 12. An opening 121 is defined in the side plate 12 adjacent to the end plate 16. A plurality of columnar anchoring protrusions 123 extend outward from the side plate 12 substantially adjacent to the opening 121. Two inserting pins 162 extend forward from the end plate 16. Each of the inserting pins 162 includes a base 1620 abutting against the end plate 16, a first inserting segment 1621 extending from the base 1620, and a second inserting segment 1623 extending from the first inserting segment 1621. The first inserting segment 1621 can pass through one of the plurality of through holes 82 of the first rack post 80, but cannot pass through one of the plurality of through holes 92 of the second rack post 90. The diameter of the second inserting segment 1623 is smaller than the diameter of the first inserting segment 1621, enabling the second inserting segment 1623 to pass through either one of the plurality of through holes 82 of the first rack post 80, or one of the plurality of through holes 92 of the second rack post 90. A shoulder 1625 is formed at a distal end of the first inserting segment 1621 facing the second inserting segment 1623.

The actuating member 20 includes a positioning portion 21 formed at an end of the actuating member 20, and two abutting tabs 23 are formed at a middle of the actuating member 20.

In one embodiment, the latch member 30 is a one-body formed spring piece, and includes a middle plate 31 and two parallel latch arms 33 vertically extending from the middle plate 31. The middle plate 31 is substantially "Y"-shaped, and includes a mounting portion 311 and two linking portions 313 slantingly extending from a front end of the mounting portion 311. A plurality of fixing holes 3112 is defined in the mounting portion 311 adjacent to a rear end of the mounting portion 311. The mounting portion 311 defines a depression 3113 facing the supporting bracket 10 and a retaining hole 3115 adjacent to the depression 3113. Each of the latch arms 33 includes a first arm body 332 and a second arm body 334 perpendicular to the first arm body 332. The first arm bodies 332 of the two latch arms 33 perpendicularly extend inwards from the corresponding linking portions 313 of the middle plate 31. The second arm bodies 334 extend forwards from distal ends of the corresponding first arm bodies 332. A first engaging tab 3341 and a second engaging tab 3342 protrude from a side of the second arm body 334 of each of the latch arms 33, and respectively arranged at a middle and a distal end of the second arm body 334.

Figure 3:
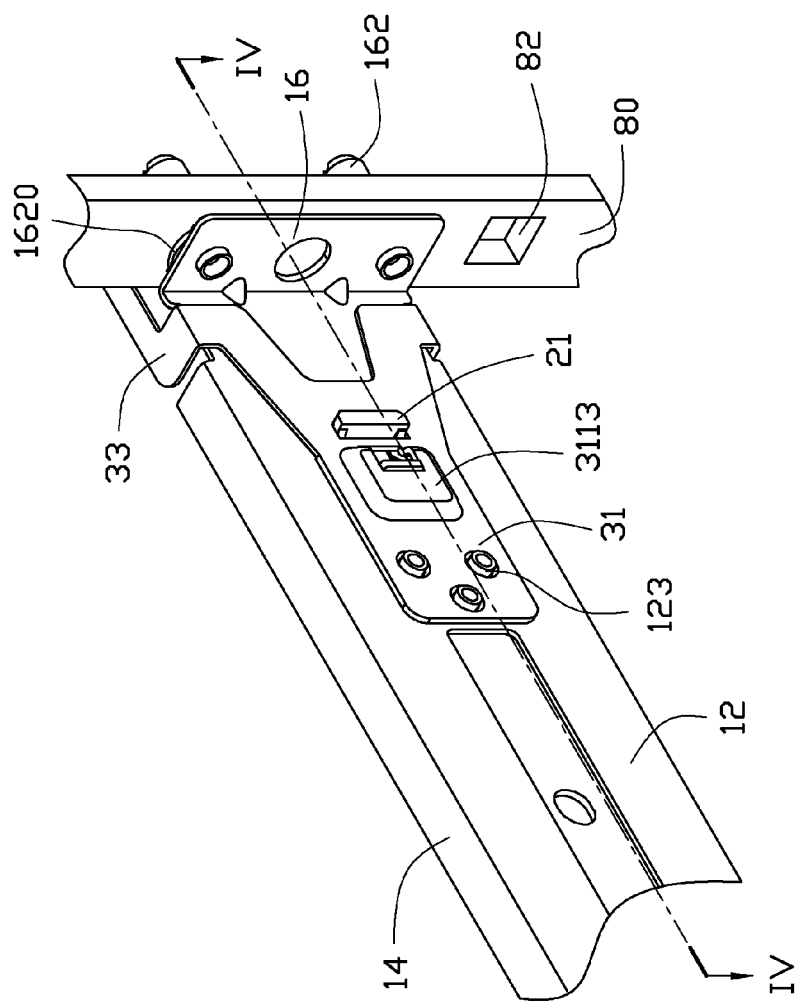
FIG. 3 is an assembled view of FIG. 1.
Figure 4:
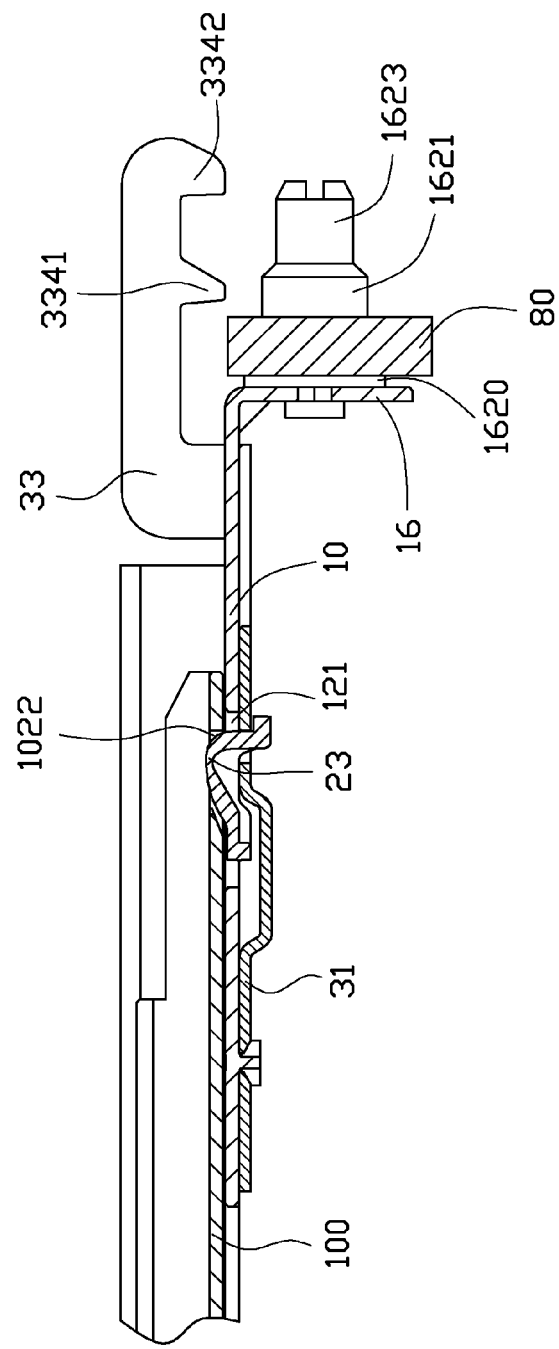
FIGS. 4 and 5 are sectional views taken along line IV-IV of FIG. 3, respectively showing the mounting apparatus in a lock status and an unlock status.

Referring to FIGS. 3 and 4, in assembly, the actuating member 20 is mounted to the latch member 30, with the positioning portion 21 of the actuating member 20 retained in retaining hole 3115 of the latch member 30, and the actuating member 20 is aligned with the depression 3113 of the latch member 30. The latch member 30 is mounted to the supporting bracket 10, with the plurality of anchoring protrusions 123 of the supporting bracket 10 fixed in the corresponding fixing holes 3112 of the latch member 30. The middle plate 31 of the latch member 30 abuts against an outer surface of the side plate 12 of the supporting bracket 10, and actuating member 20 is received in the opening 121 of the supporting bracket 10. The supporting bracket 10 is slidably coupled to the slide rail 100 and slides adjacent to the front end of the slide rail 100, with the abutting tabs 23 extending through the corresponding slots 1022 of the slide rail 100, and the latch arms 33 of the latch member 30 extending out of the front end of the slide rail 100. The first engaging tab 3341 of each of the latch arms 33 aligns with the first inserting segment 1621 of one of the inserting pins 1625, and the second engaging tab 3342 aligns with the second inserting segment 1623 of the inserting pin 162.

Figure 5:
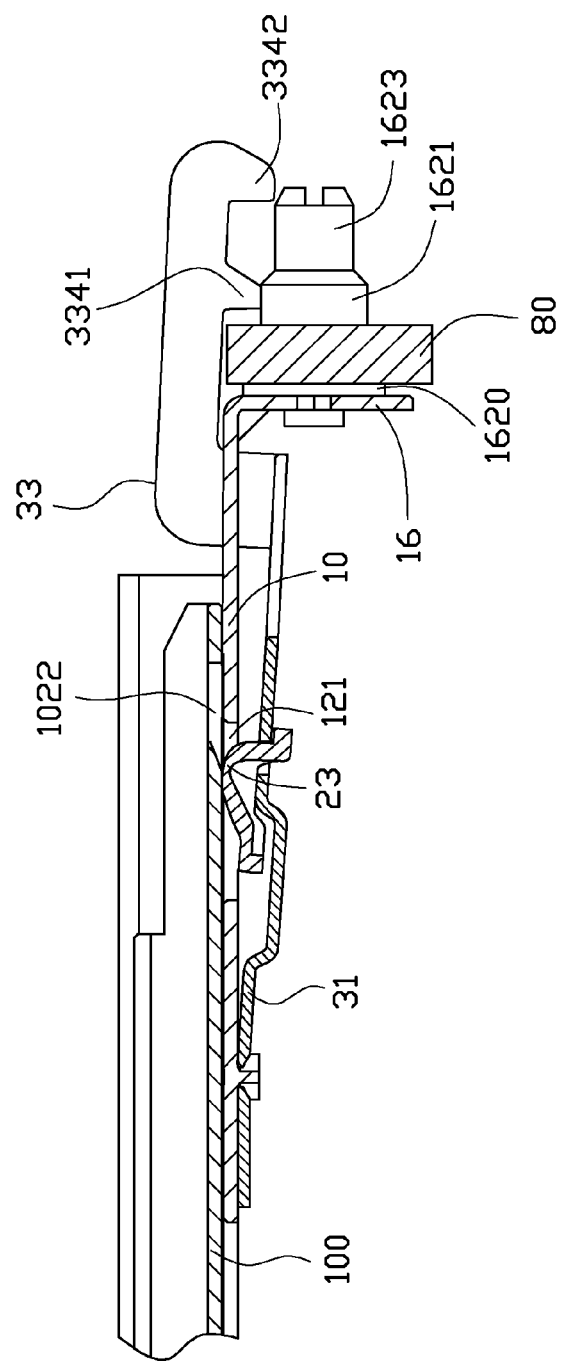

Referring to FIGS. 3 to 5, to attach the slide rail 100 to one of the plurality of first rack posts 80, the supporting bracket 10 is moved to the first rack post 80, with the latch arms 33 of the latch member 30 being beside an inner side of the first rack post 80, and the inserting pins 162 of the mounting bracket 10 engage into the corresponding two of the plurality of through holes 82 of the first rack post 80. When the bases 1620 of the inserting pins 162, or the end plate 16, abuts against a rear surface of the rack post 80, the supporting bracket 10 stops moving forwards. The slide rail 100 is moved forwards further, causing a relative sliding between the slide rail 100 and the supporting bracket 10. Therefore, the abutting tabs 23 of the actuating member 20 slide out of the corresponding slots 1022 of the slide rail 100, to abut against the web 102 of the slide rail 100. The actuating member 20 is tilted and urges the latch member 30. The latch arms 33 lean to the first rack post 80, and the first engaging tabs 3341 abut against a front surface of the first rack post 80. The supporting bracket 10 is prevented from moving rearwards to retract the inserting pins 162 from the corresponding through holes 82 of the first rack post 80.

To detach the slide rail 100 from the first rack post 80, the slide rail 100 is slid rearwards to cause a relative sliding between the slide rail 100 and the supporting bracket 10, until the abutting tabs 23 engage in the corresponding slots 1022 of the slide rail 100. The latch member 30 restores and the latch arms 33 move away from the first rack post 80. The first engaging tabs 3341 of the latch member 30 disengage from the first rack post 80, thereby the supporting bracket 10 moves rearwards, causing the inserting pins 162 to retract from the corresponding through holes 82 of the first rack post 80. Therefore, the slide rail 100 is ready for being detached from the first rack post 80.

Figure 7:
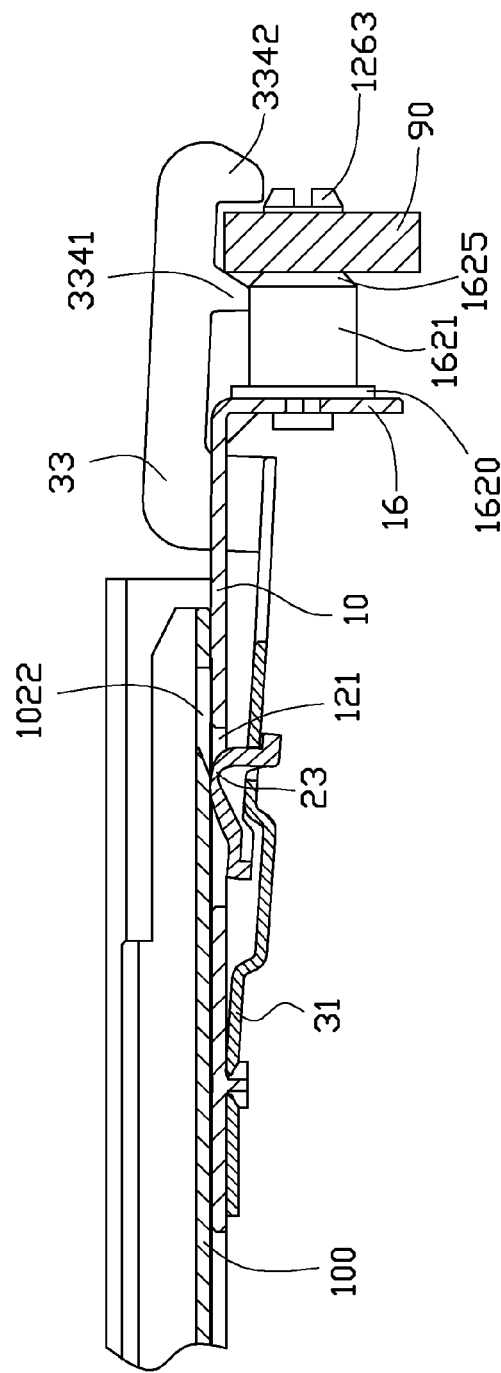
FIG. 7 is a sectional view taken along the line VII-VII of FIG. 6, showing the mounting apparatus in a lock status.

Referring to FIGS. 6 and 7, to attach the slide rail 100 to one of the plurality of second rack posts 90, the second inserting segments 1623 of the inserting pins 162 of the supporting bracket 10 extend through the corresponding two of the plurality of through holes 92 of the second rack post 90 and the shoulders 1625 of the inserting pins 162 abut against a rear face of the rack post 90. With the sliding of the slide rail 100 relative to the supporting bracket 10, the abutting tabs 23 of the actuating member 20 disengage from the corresponding slots 1022 of the slide rail 100 and abut against the web 102 of the slide rail 100. The latch member 30 is biased and the latch arms 33 of the latch member 30 lean to the second rack post 90. The second engaging tabs 3342 abut against a front face of the second rack post 90, and the supporting bracket 10 is prevented from moving rearwards to retract the inserting pins 162 from the corresponding through holes 92 of the second rack post 90.

It is believed that the present embodiment and its advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. A mounting apparatus for mounting a slide rail to a rack post, the rack post defining a plurality of through holes, the mounting apparatus comprising:
    a supporting bracket slidably mounted to the slide rail, the supporting bracket comprising an end plate perpendicular to a sliding direction of the supporting bracket, and an inserting pin extending from the end plate;
    a latch member comprising a middle plate fixed to the supporting bracket, and a latch arm extending forwards from the middle plate, the latch arm comprising at least one engaging tab; and
    an actuating member clipped to the latch member, wherein the actuating member comprises an abutting tab;
    wherein the inserting pin is operable to be inserted into one of the plurality of through holes of the rack post, the at least one engaging tab abuts against a side of the rack post opposite to the end plate of the supporting bracket in response to the latch member being deformed to prevent the inserting pin of the supporting bracket from retracting from the corresponding through hole of the rack post, the inserting pin is capable of retracting from the corresponding through hole of the rack post when the latch member is restored; the supporting bracket is slidable relative to the slide rail between a first position, where the abutting tab abuts against the slide rail to deform the latch member, and a second position, where the abutting tab does not deform the latch member.

2. The mounting apparatus of claim 1, wherein the latch member is a one-body formed spring piece.

3. The mounting apparatus of claim 2, wherein the inserting pin comprises a first inserting segment adjacent to the end plate, and a second inserting segment extending from a distal end of the first inserting segment away from the end plate, the first inserting segment has a diameter greater than a diameter of the second inserting segment, the at least one engaging tab of the latch arm comprises a first engaging tab abutting against the rack post, in response to the first inserting segment being received in the through hole of the rack post and the latch member being deformed, and a second engaging tab abutting against the rack post, in response to the second inserting segment being received in the through hole of the rack post and the latch member being deformed, wherein the inserting pin further comprises a shoulder located at an approximate midpoint of the inserting pin at the junction of the first and second inserting segments.

4. The mounting apparatus of claim 1, wherein the abutting tab extends through a slot defined in the slide rail in response to the supporting bracket at the second position.

* * * * *